(12) United States Patent
Sethuraman et al.

(10) Patent No.: US 10,740,177 B2
(45) Date of Patent: Aug. 11, 2020

(54) OPTIMIZING ERROR CORRECTING CODE IN THREE-DIMENSIONAL STACKED MEMORY

(71) Applicant: International Business Machines Corporation, Armonk, NY (US)

(72) Inventors: Saravanan Sethuraman, Bangalore (IN); Diyanesh B. Chinnakkonda Vidyapoornachary, Bangalore (IN); Sridhar Rangarajan, Bangalore (IN); Kirk D. Peterson, Jericho, VT (US); John B. Deforge, Barre, VT (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 15/872,097

(22) Filed: Jan. 16, 2018

(65) Prior Publication Data

US 2019/0220351 A1 Jul. 18, 2019

(51) Int. Cl.
*G06F 11/10* (2006.01)
*G06F 3/06* (2006.01)
(Continued)

(52) U.S. Cl.
CPC ........ *G06F 11/1068* (2013.01); *G06F 3/0604* (2013.01); *G06F 3/0625* (2013.01); *G06F 3/0631* (2013.01); *G06F 3/0634* (2013.01); *G06F 3/0679* (2013.01); *G11C 5/02* (2013.01); *G11C 5/06* (2013.01); *G11C 29/028* (2013.01);
(Continued)

(58) Field of Classification Search
CPC .. G06F 11/1068; G06F 3/0604; G06F 3/0625; G06F 3/0631; G06F 3/0634; G06F 3/0679; G06F 11/1072; G11C 5/02; G11C 5/06; G11C 29/52
USPC ................ 714/764, 768–770, 773, 799, 800; 365/200, 201, 185.09
See application file for complete search history.

(56) References Cited

U.S. PATENT DOCUMENTS 7,558,096 B2 * 7/2009 Ikeda ........................ G11C 5/02
365/185.09
8,032,804 B2 * 10/2011 Jeddeloh ............... G06F 11/073
714/721
(Continued)

OTHER PUBLICATIONS

Li at al., MAGE: Adaptive Granularity and ECC for Resilient and Power Efficient Memory Systems, 2012, IEEE, pp. 1-11 (Year: 2012).*

(Continued)

*Primary Examiner* — John J Tabone, Jr.
(74) *Attorney, Agent, or Firm* — Bryan Bortnick

(57) ABSTRACT

Optimizing error correcting code (ECC) in three-dimensional (3D) stacked memory including selecting, as an ECC memory chip, a memory chip of a plurality of memory chips in a 3D stacked memory structure, wherein the 3D stacked memory structure comprises the plurality of memory chips stacked vertically and coupled together using through-silicon vias; determining that an error has been detected in one of the plurality of memory chips in the 3D stacked memory structure; selecting, based on the detected error, an order of an ECC decoder of the ECC stored in the ECC memory chip; and correcting the detected error in the 3D stacked memory structure using the ECC stored in the ECC memory chip.

20 Claims, 8 Drawing Sheets

(51) Int. Cl.
*G11C 5/06* (2006.01)
*G11C 29/52* (2006.01)
*G11C 5/02* (2006.01)
*G11C 29/42* (2006.01)
*G11C 29/02* (2006.01)
*G11C 29/04* (2006.01)

(52) U.S. Cl.
CPC .............. *G11C 29/42* (2013.01); *G11C 29/52* (2013.01); *G11C 5/025* (2013.01); *G11C 2029/0411* (2013.01)

(56) References Cited

U.S. PATENT DOCUMENTS

| | | | | |
|---|---|---|---|---|
| 9,009,548 | B2* | 4/2015 | Gollub | G11C 29/10 365/201 |
| 9,672,942 | B2 | 6/2017 | Yoon et al. | |
| 10,250,281 | B2* | 4/2019 | Achtenberg | H03M 13/3707 |
| 2010/0192041 | A1* | 7/2010 | Jeddeloh | G11C 29/4401 714/763 |
| 2012/0185753 | A1* | 7/2012 | Chen | G06F 11/1048 714/773 |
| 2013/0294184 | A1* | 11/2013 | Yang | H01L 25/0657 365/200 |
| 2013/0322174 | A1* | 12/2013 | Li | G11C 16/0483 365/185.09 |
| 2013/0326312 | A1* | 12/2013 | Lee | G06F 11/1068 714/773 |
| 2014/0129903 | A1* | 5/2014 | Yoon | G06F 11/1048 714/764 |
| 2015/0271921 | A1* | 9/2015 | Hu | H05K 1/14 361/792 |
| 2015/0303948 | A1 | 10/2015 | Yoon et al. | |
| 2016/0093390 | A1* | 3/2016 | Yuan | G11C 16/3427 714/764 |
| 2016/0124810 | A1* | 5/2016 | Yang | G11C 29/52 714/764 |
| 2016/0139989 | A1* | 5/2016 | Muralimanohar | G06F 11/1012 714/764 |
| 2017/0004040 | A1* | 1/2017 | Chinnakkonda Vidyapoornachary | G11C 29/52 |
| 2017/0123896 | A1 | 5/2017 | Baek et al. | |
| 2017/0123898 | A1* | 5/2017 | Ryabinin | G06F 11/1068 |
| 2017/0269991 | A1* | 9/2017 | Bazarsky | G06F 11/1012 |
| 2018/0025777 | A1* | 1/2018 | Jacobvitz | G11C 11/5642 714/764 |
| 2018/0032396 | A1* | 2/2018 | Sharon | G11C 11/5642 |
| 2018/0157551 | A1* | 6/2018 | Ryabinin | G06F 11/0727 |
| 2018/0159553 | A1* | 6/2018 | Sharon | H03M 13/1111 |
| 2018/0159555 | A1* | 6/2018 | Ryabinin | H03M 13/1575 |
| 2018/0159556 | A1* | 6/2018 | Dumchin | H03M 13/255 |
| 2018/0175889 | A1* | 6/2018 | Bazarsky | H03M 13/3723 |
| 2018/0191381 | A1* | 7/2018 | Achtenberg | H03M 13/3707 |
| 2019/0012230 | A1* | 1/2019 | Chung | G06F 11/1048 |
| 2019/0012231 | A1* | 1/2019 | Chung | G06F 11/1068 |
| 2019/0102316 | A1* | 4/2019 | Hara | G06F 12/10 |

OTHER PUBLICATIONS

Nair et al., Citadel: Efficiently Protecting Stacked Memory from TSV and Large Granularity Failures, Jan. 2016, ACM Transactions on Architecture and Code Optimization, vol. 12, No. 4, Article 49, pp. 49:1-49:24 (Year: 2016).*

Datta et al., Designing a Fast and Adaptive Error Correction Scheme for Increasing the Lifetime of Phase Change Memories, 2011, IEEE, pp. 134-139 (Year: 2011).*

* cited by examiner

OPTIMIZING ERROR CORRECTING CODE IN THREE-DIMENSIONAL STACKED MEMORY

BACKGROUND

Field of the Invention

The field of the invention is data processing, or, more specifically, methods, apparatus, and products for optimizing error correcting code in three-dimensional stacked memory.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for optimizing error correcting code (ECC) in three-dimensional (3D) stacked memory are disclosed in this specification. Optimizing ECC in 3D stacked memory includes selecting, as an ECC memory chip, a memory chip of a plurality of memory chips in a 3D stacked memory structure, wherein the 3D stacked memory structure comprises the plurality of memory chips stacked vertically and coupled together using through-silicon vias; determining that an error has been detected in one of the plurality of memory chips in the 3D stacked memory structure; selecting, based on the detected error, an order of an ECC decoder of the ECC stored in the ECC memory chip; and correcting the detected error in the 3D stacked memory structure using the ECC stored in the ECC memory chip.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
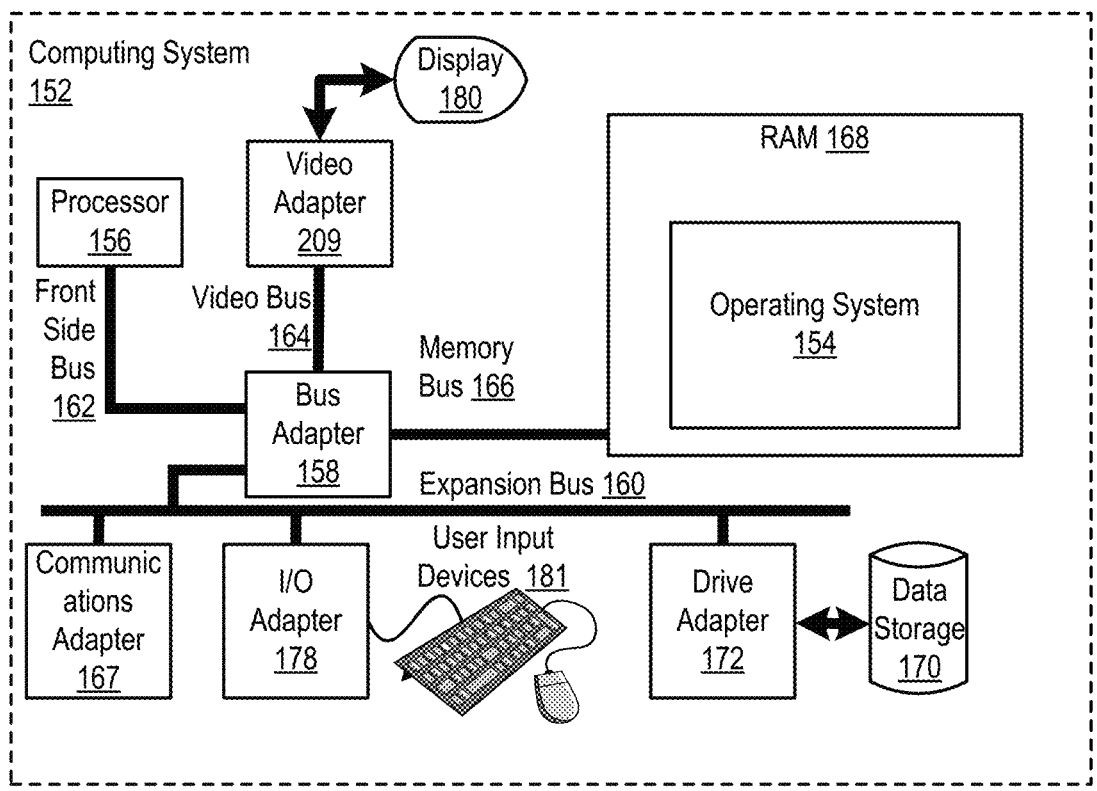
FIG. 1 sets forth a block diagram of an example system configured for optimizing error correcting code (ECC) in three-dimensional (3D) stacked memory according to embodiments of the present invention.

Exemplary methods, apparatus, and products for optimizing error correcting code (ECC) in three-dimensional (3D) stacked memory in accordance with the present invention are described with reference to the accompanying drawings, beginning with FIG. 1. FIG. 1 sets forth a block diagram of automated computing machinery comprising an exemplary computing system (152) configured for optimizing ECC in 3D stacked memory according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for optimizing ECC in 3D stacked memory according to embodiments of the present invention include UNIX™, Linux™, Microsoft Windows™, AIX™, IBM's i OS™, and others as will occur to those of skill in the art. The operating system (154) in the example of FIG. 1 is shown in RAM (168), but many components of such software typically are stored in non-volatile memory also, such as, for example, on a disk drive (170).

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for optimizing ECC in 3D stacked memory according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for optimizing ECC in 3D stacked memory according to embodiments of the present invention include modems for wired dial-up communications, Ethernet (IEEE 802.3) adapters for wired data communications, and 802.11 adapters for wireless data communications.

Figure 2:
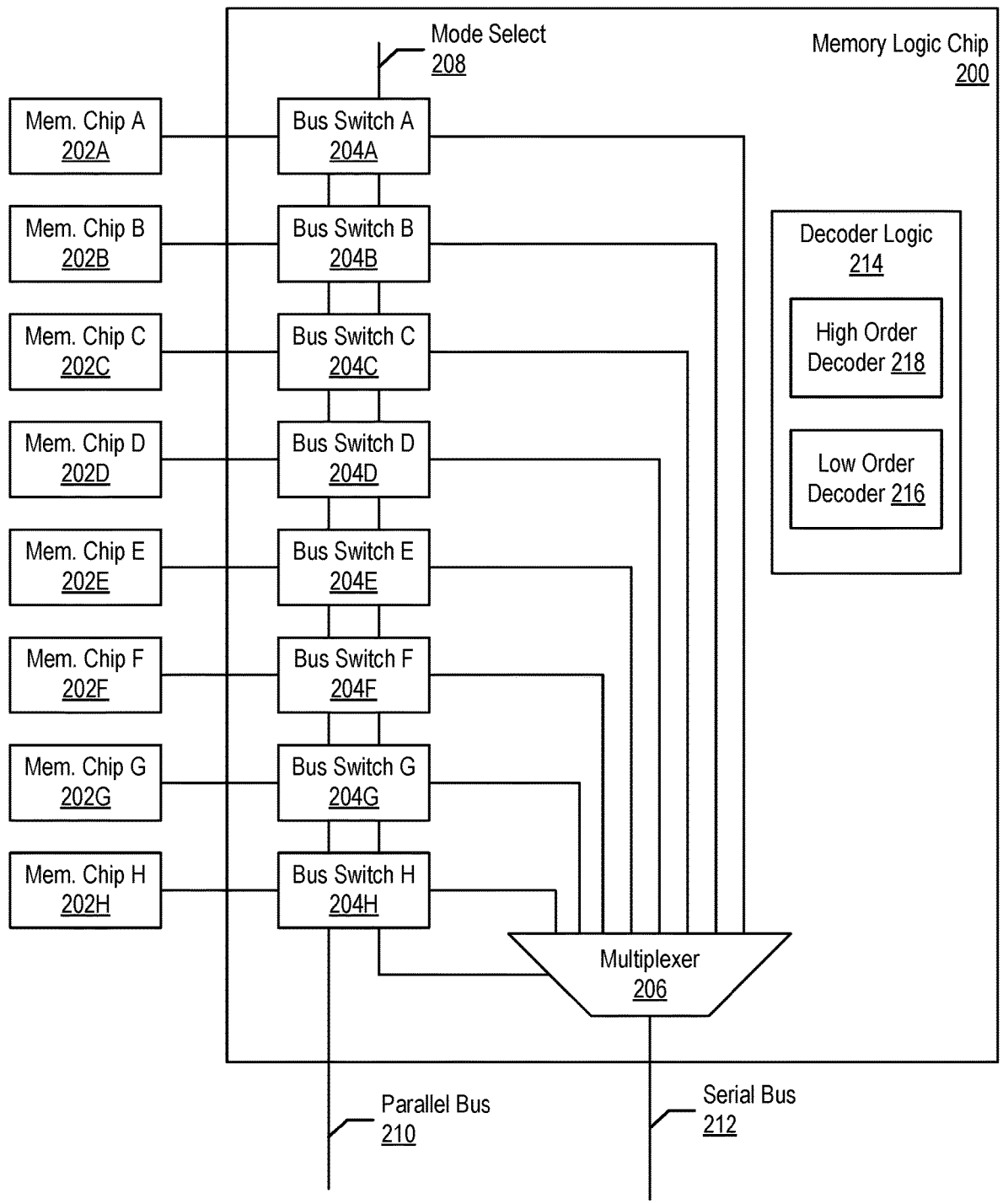
FIG. 2 sets forth a block diagram of an example system configured for optimizing ECC in 3D stacked memory according to embodiments of the present invention.

FIG. 2 shows an exemplary system for optimizing error correcting code (ECC) in three-dimensional (3D) stacked memory according to embodiments of the present invention. Specifically, FIG. 2 shows 3D stacked memory attached to a memory logic chip. As shown in FIG. 2, the memory system includes a memory logic chip (200) coupled to a stack of memory chips (memory chip A (202A), memory chip B (202B), memory chip C (202C), memory chip D (202D), memory chip E (202E), memory chip F (202F), memory chip G (202G), memory chip H (202H)). Each memory chip is coupled to a bus switch (bus switch A (204A), bus switch B (204B), bus switch C (204C), bus switch D (204D), bus switch E (204E), bus switch F (204F), bus switch G (204G), bus switch H (204H)) within the memory logic chip (200). A mode select line (208) and the multiplexer (206) allows the memory logic chip (200) to select whether the stored data is provided via the parallel bus (210) or the serial bus (212).

The memory logic chip (200) is an aggregation of logic and hardware within an integrated circuit that manages the 3D stacked memory. The memory logic chip (200) may be part of a memory controller that selects a memory chip as an ECC memory chip, determines that an error has been detected in one of the memory chips, selects an order of the ECC decoder; and corrects the detected error using the ECC stored in the ECC memory chip.

A 3D stacked memory structure is a memory architecture in which memory chips are stacked vertically and coupled together using through-silicon vias. A through-silicon via (TSV) is a vertical communicative coupling between each memory chip and to the memory logic chip (200). A 3D stacked memory structure may be a configuration of memory chips in which the largest side of each memory chip faces the adjacent memory chip in the 3D stacked memory structure. The memory chips in the 3D stacked memory structure are oriented vertically such that the largest side of each memory chip faces either "up" and toward the top of the 3D stacked memory structure, or "down" and toward the bottom of the 3D stacked memory structure. The memory logic chip (200) may be at the bottom of the 3D stacked memory structure.

The memory logic chip (200) and/or a memory controller may also include ECC decoder logic (214). ECC decoder logic is hardware logic that uses ECC in an ECC memory chip to rectify correctable errors on the memory chips of the 3D stacked memory system. Different orders of ECC decoders operate using a different amount of ECC stored in the ECC memory chip. A low order ECC decoder (216) uses fewer hardware resources and fewer bits of ECC relative to a high order ECC decoder (218). Conversely, a high order ECC decoder uses more hardware resources and more bits of ECC relative to a low order ECC decoder. A low order ECC decoder may be less robust and less able to correct more complex errors than a high order ECC decoder. Conversely, a high order ECC decoder may be more robust and more able to correct complex errors than a low order ECC decoder.

Different types of memory chips may require different ECC decoders. For example, flash memory chips may only require low order ECC decoders for maximum performance and to preserve endurance with a signature that uses lower bits. As another example, dynamic random access memory (DRAM) chips may require high order ECC decoders with a stronger ECC signature for maximum reliability and corrective ability. DRAM may also require a battery backup to prevent data loss in the case of a power loss event.

The memory chips (memory chip A (202A), memory chip B (202B), memory chip C (202C), memory chip D (202D), memory chip E (202E), memory chip F (202F), memory chip G (202G), memory chip H (202H)) are hardware storage devices used to store data. The memory chips may include, for example, static random access memory (SRAM) chips, DRAM chips, flash chips, or spin-transfer torque magnetic random access memory (STT-MRAM) chips. Further, the memory chips coupled to the memory logic chip may include a heterogeneous mix of chip types. For example, the group of memory chips may include one or more of, for example, SRAM chips, DRAM chips, flash chips, or STT-MRAM chips. The memory chips may operate together as a single memory rank in which each memory chip in the memory rank is vertically oriented in a 3D stacked memory structure.

The bus switches (bus switch A (204A), bus switch B (204B), bus switch C (204C), bus switch D (204D), bus switch E (204E), bus switch F (204F), bus switch G (204G), bus switch H (204H)) are switches employed by the memory logic chip (200) to alternate between the parallel bus (210) and the serial bus (212) for data output. The memory logic chip (200) may use the mode select line (208) to activate or deactivate each bus switch.

The parallel bus (210) is an output line that outputs data from each memory chip at one time. The serial bus (212) is an output line that outputs data from one memory chip at one time. The multiplexer (206) selects one of the inputs from the bus switches and sends the signal on that input to the serial bus (212) output. The multiplexer (206) allows the memory logic chip (200) to output a group of bits from the same memory chip at one time. The TSV may be employed as connections between the multiplexer (206) and the bus switches.

Figure 3:
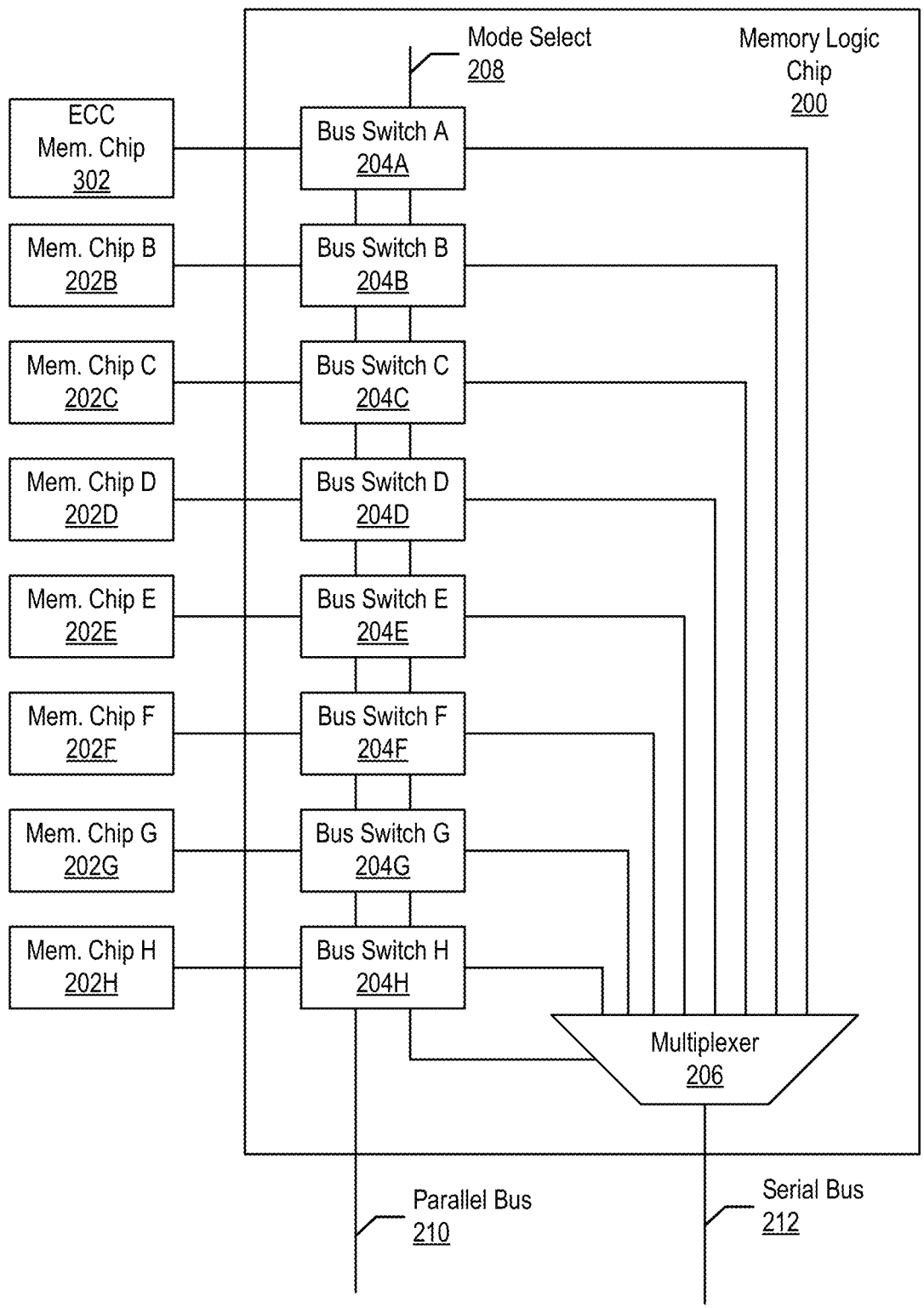
FIG. 3 sets forth a block diagram of an example system configured for optimizing ECC in 3D stacked memory according to embodiments of the present invention.

FIG. 3 shows an exemplary system for optimizing error correcting code (ECC) in three-dimensional (3D) stacked memory according to embodiments of the present invention. As shown in FIG. 3, memory chip A (202A) from FIG. 2 has been selected as the ECC memory chip (302). Specifically, the memory logic chip (200) and/or the memory controller has selected the top memory chip as the ECC memory chip (302). If, for example, memory chip A (202A) is not capable of hosting the ECC (e.g., does not include enough uncorrupted space, is an inefficient type of memory for ECC purposes), then another memory chip may be selected, such as the second top-most memory chip (e.g., memory chip B (202B)).

Figure 4:
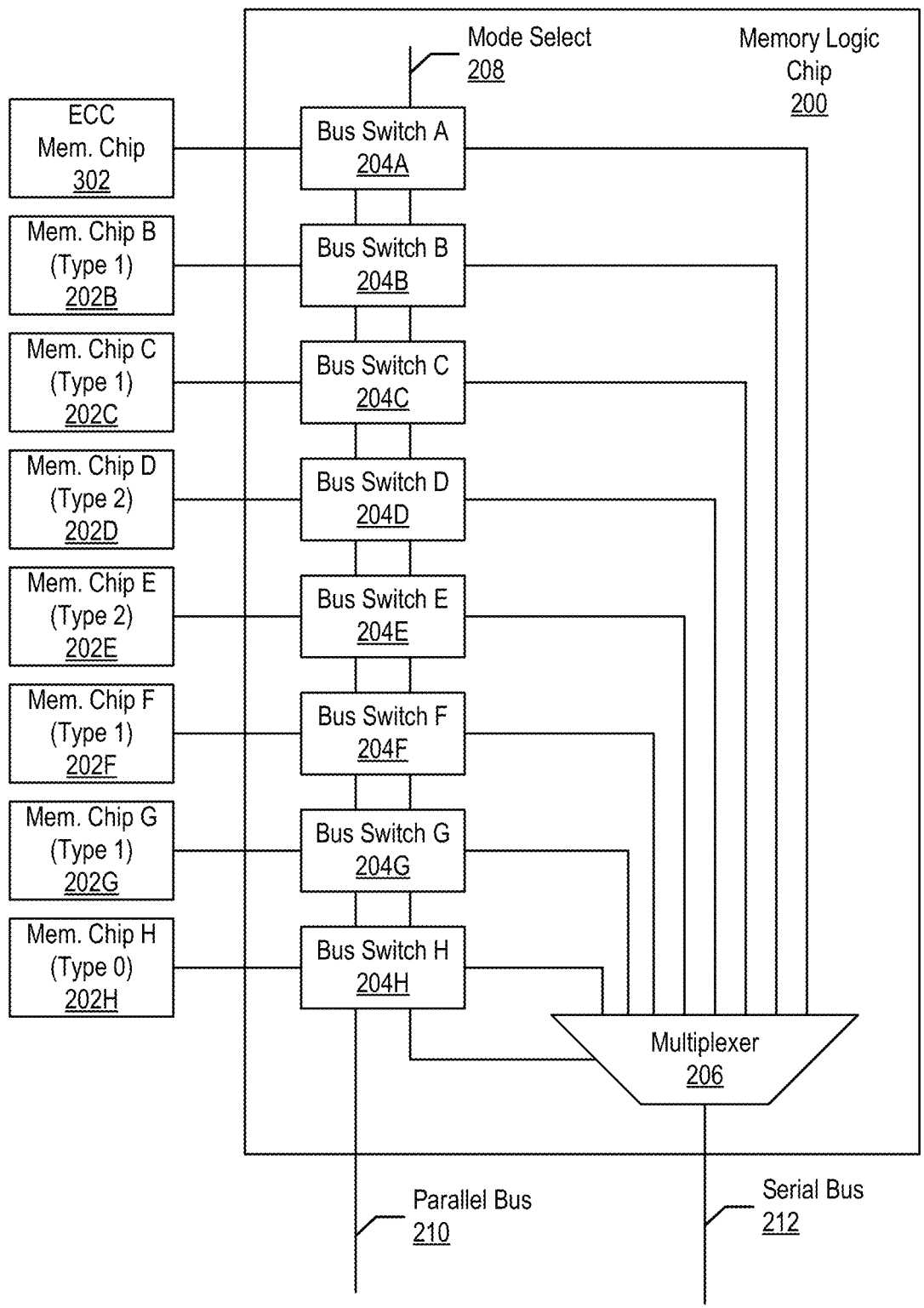
FIG. 4 sets forth a block diagram of an example system configured for optimizing ECC in 3D stacked memory according to embodiments of the present invention.

FIG. 4 shows an exemplary system for optimizing error correcting code (ECC) in three-dimensional (3D) stacked memory according to embodiments of the present invention. Specifically, FIG. 4 shows a heterogeneous mix of memory chip types in the 3D stacked memory. As shown in FIG. 4, the top-most memory chip has been selected as the ECC memory chip (302). The ECC memory chip may be any type of memory chip (e.g., type 0, type 1, type 2). Memory chip H (202H) is a type 0 memory chip. Memory chip G (202G), memory chip F (202F), memory chip C (202C), and memory chip B (202B) are each type 1 memory chips. Finally, memory chip E (202E) and memory chip D (202D) are type 2 memory chips. The different types of memory chips may include, for example, SRAM chips, DRAM chips, flash chips, or STT-MRAM chips. For example, type 0 may be SRAM, type 1 may be DRAM, and type 2 may be flash chips.

Figure 5:
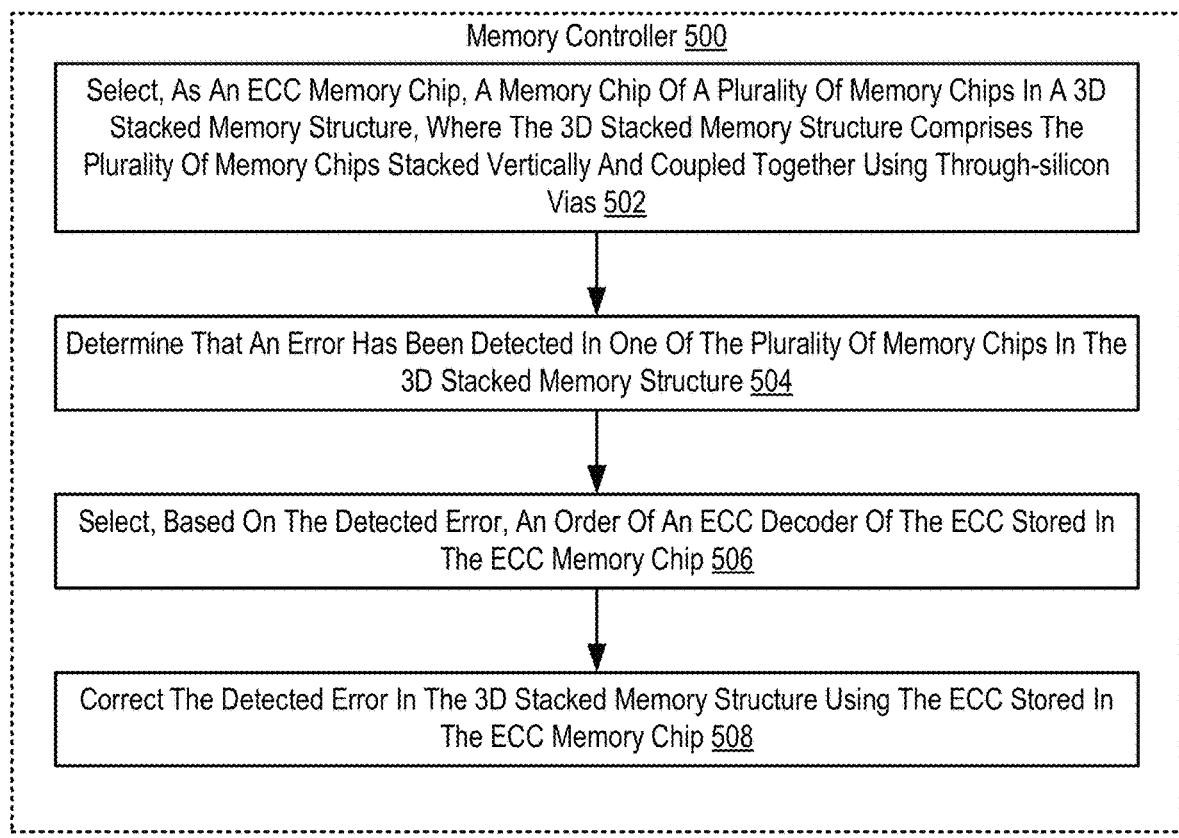
FIG. 5 sets forth a flow chart illustrating an exemplary method for optimizing ECC in 3D stacked memory according to embodiments of the present invention.

For further explanation, FIG. 5 sets forth a flow chart illustrating an exemplary method for optimizing error correcting code (ECC) in three-dimensional (3D) stacked memory according to embodiments of the present invention that includes selecting (502), as an ECC memory chip, a memory chip of a plurality of memory chips in a 3D stacked memory structure, wherein the 3D stacked memory structure comprises the plurality of memory chips stacked vertically and coupled together using through-silicon vias. Selecting (502), as an ECC memory chip, a memory chip of a plurality of memory chips in a 3D stacked memory structure, wherein the 3D stacked memory structure comprises the plurality of memory chips stacked vertically and coupled together using through-silicon vias may be carried out by the memory logic chip and/or the memory controller determining which memory chip among the memory chips coupled to the memory logic chip to designate as the ECC memory chip. The ECC memory chip (302) is a memory chip selected to store the ECC for use by the ECC decoders to perform error correction on the memory chips. More than one memory chip may be designated as ECC memory chips.

A memory chip may be selected as the ECC memory chip based on a selection policy. For example, one selection policy may dictate that the top memory chip be selected as the ECC memory chip unless the memory chip is not capable of hosting the ECC (e.g., does not include enough uncorrupted space). Another selection policy may dictate that the top memory chip of a specific type of memory chip is selected. For example, the topmost DRAM chip may be selected as the ECC memory chip.

The method of FIG. 5 further includes determining (504) that an error has been detected in one of the plurality of memory chips in the 3D stacked memory structure. Determining (504) that an error has been detected in one of the plurality of memory chips in the 3D stacked memory structure may be carried out by the memory controller (500) receiving a notification that an error has been detected by the memory controller or other memory component. The error may be detected by software which subsequently notifies the memory controller of the detected error. The memory controller may perform additional tests on the memory cell or cells to determine the type of error.

The method of FIG. 5 further includes selecting (506), based on the detected error, an order of an ECC decoder of the ECC stored in the ECC memory chip. Selecting (506), based on the detected error, an order of an ECC decoder of the ECC stored in the ECC memory chip may be carried out by the memory controller (500) utilizing a higher or lower order ECC decoder based on the detected error.

Selecting (506) the order of an ECC decoder may be based on the number of errors detected. For example, a lower number of errors detected, either total or rate of errors, may result in the memory controller (500) selecting a lower order ECC decoder for error correction. Similarly, a higher number of errors detected may result in the memory controller (500) selecting a higher order ECC decoder for error correction.

Selecting (506) the order of an ECC decoder may be based on the type of errors detected. For example, simpler errors may require fewer computations and ECC bits to correct, while more complex errors require more computations and ECC bits to correct. Consequently, the number of simpler errors detected in the 3D stacked memory structure may allow the memory controller (500) to utilize a lower order ECC decoder. Similarly, the number of complex errors detected in the 3D stacked memory structure may necessitate that the memory controller (500) utilize a higher order ECC decoder.

Selecting (506) the order of an ECC decoder may be based on the type of chip upon which the error was detected. In a 3D stacked memory structure with a heterogeneous group of memory chips, the number of errors on each type of memory chip may determine the order of the ECC decoder or decoders. For example, if the number of detected errors among all memory chips of one type of memory chip do not exceed a particular threshold, then the memory controller (500) may select a lower order ECC decoder.

Selecting (506) the order of an ECC decoder may be based on the makeup of the 3D stacked memory structure. Specifically, the memory controller may select an ECC decoder based on the number and type of each memory chip in the 3D stacked memory structure. For example, if the group of memory chips is 57% flash chips and 43% DRAM chips, the memory controller may select an ECC decoder best suited to that particular memory chip makeup.

The method of FIG. 5 further includes correcting (508) the detected error in the 3D stacked memory structure using the ECC stored in the ECC memory chip. Correcting (508) the detected error in the 3D stacked memory structure using the ECC stored in the ECC memory chip may be carried out by the memory controller (500) using the selected ECC decoder and the ECC stored in the ECC memory chip to correct or provide the rectified data stored at the location of the error.

Figure 6:
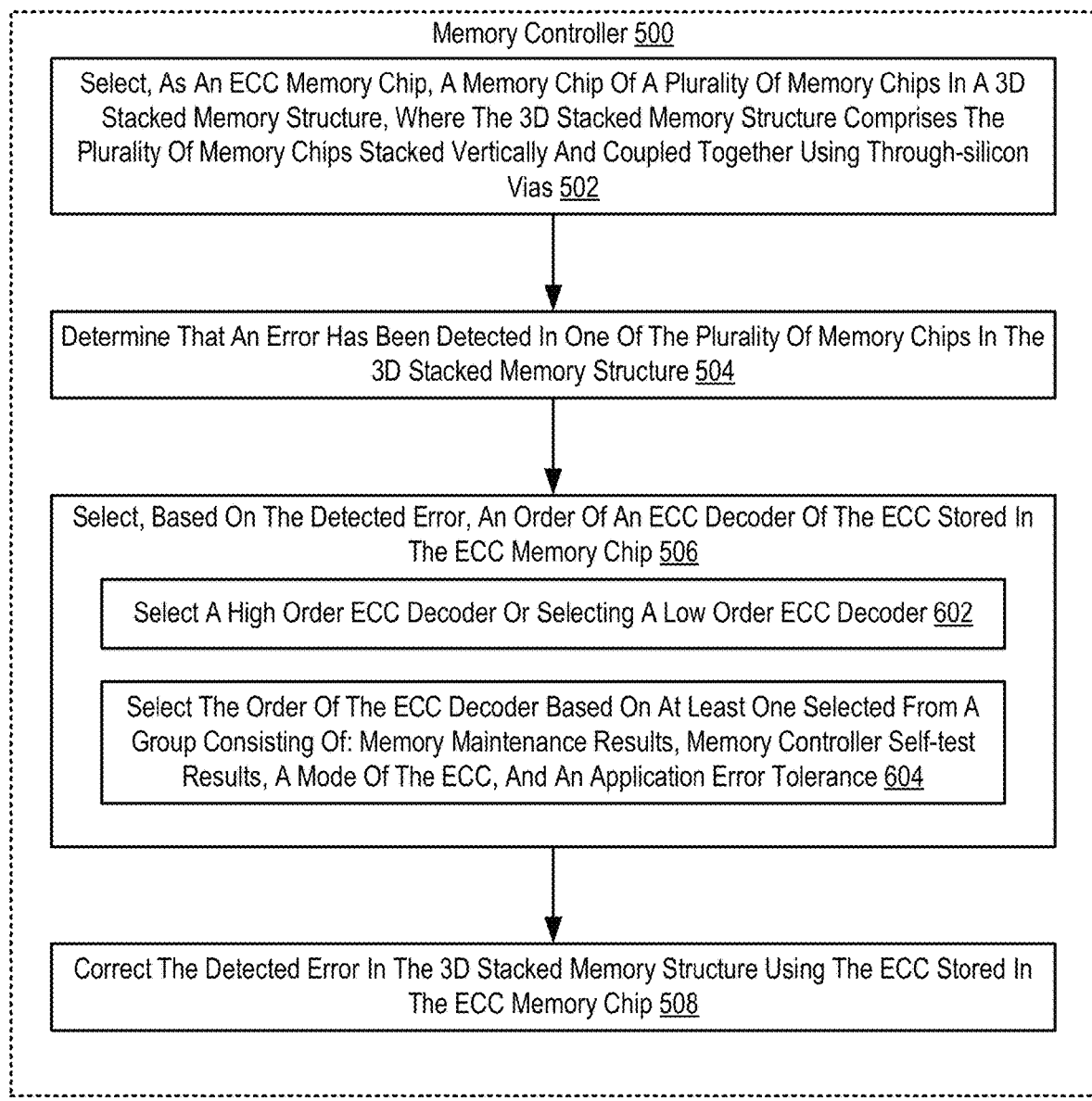
FIG. 6 sets forth a flow chart illustrating an exemplary method for optimizing ECC in 3D stacked memory according to embodiments of the present invention.

For further explanation, FIG. 6 sets forth a flow chart illustrating a further exemplary method for optimizing error correcting code (ECC) in three-dimensional (3D) stacked memory according to embodiments of the present invention that includes selecting (502), as an ECC memory chip, a memory chip of a plurality of memory chips in a 3D stacked memory structure, wherein the 3D stacked memory structure comprises the plurality of memory chips stacked vertically and coupled together using through-silicon vias; determining (504) that an error has been detected in one of the plurality of memory chips in the 3D stacked memory structure; selecting (506), based on the detected error, an order of an ECC decoder of the ECC stored in the ECC memory chip; and correcting (508) the detected error in the 3D stacked memory structure using the ECC stored in the ECC memory chip.

The method of FIG. 6 differs from the method of FIG. 5, however, in that selecting (506), based on the detected error, an order of an ECC decoder of the ECC stored in the ECC memory chip further includes selecting (602) a high order ECC decoder or selecting a low order ECC decoder; and selecting (604) the order of the ECC decoder is further based on at least one selected from a group consisting of: memory maintenance results, memory controller self-test results, a mode of the ECC, and an application error tolerance.

Selecting (602) a high order ECC decoder or selecting a low order ECC decoder may be carried out by selecting an ECC decoder that suits the current memory error condition. Selecting a low order ECC decoder may include accessing a hardware location on the memory controller or elsewhere that includes the low order ECC decoder. Similarly, selecting a high order ECC decoder may include accessing a hardware location on the memory controller or elsewhere that includes the high order ECC decoder.

Selecting (604) the order of the ECC decoder may be further based on memory maintenance results. Memory maintenance results are results of performing maintenance tasks on the memory chips. Maintenance tasks are periodic tests of cells in the memory to determine whether the cells are performing as expected. For example, a memory maintenance test may write data to a cell or group of cells then read the data to determine whether the read data matches the written data. A difference between the written data and the read data may indicate the existence of an error. A memory scrub by the memory hardware may be performed to determine whether the error is correctable using ECC.

Selecting (604) the order of the ECC decoder may be further based on memory controller self-test results. Memory controller self-test results are the results of a built-in self-test performed on the memory chips (e.g., during a startup procedure). Error detected during the self-test are recorded and further tests (e.g., memory scrub) may be performed on the detected error to determine the type of error. Each error is reported to the memory controller and/or the memory logic chip. Upon each new error reported or permanently resolved, the memory logic chip may determine if a new ECC decoder should be selected (e.g., based on the conditions described above in regard to FIG. 5).

Selecting (604) the order of the ECC decoder may be further based on mode of the ECC. The mode of the ECC refers to the manner in which the ECC bits are stored and read. During transparent mode the ECC decoder may utilize more or less ECC bits, and therefore require a higher or lower order ECC decoder.

Selecting (604) the order of the ECC decoder may be further based on the application error tolerance. The application error tolerance is the number of errors that an application will tolerate before undesired results occur. If, for example, the application error tolerance is high, a low order ECC decoder may be selected. Similarly, if the application error tolerance is low, a high order ECC decoder may be selected.

Figure 7:
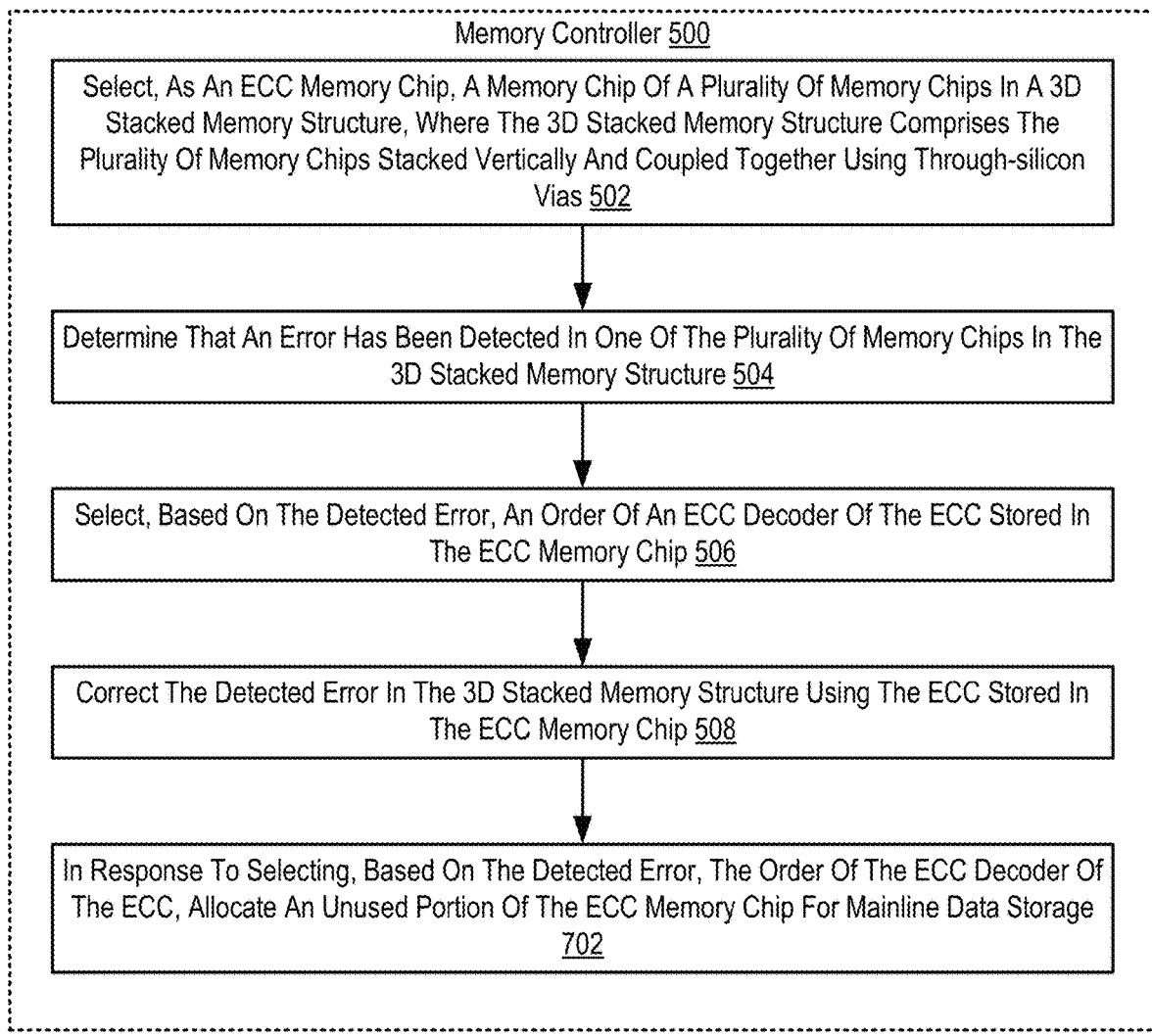
FIG. 7 sets forth a flow chart illustrating an exemplary method for optimizing ECC in 3D stacked memory according to embodiments of the present invention.

For further explanation, FIG. 7 sets forth a flow chart illustrating a further exemplary method for optimizing error correcting code (ECC) in three-dimensional (3D) stacked memory according to embodiments of the present invention that includes selecting (502), as an ECC memory chip, a memory chip of a plurality of memory chips in a 3D stacked memory structure, wherein the 3D stacked memory structure comprises the plurality of memory chips stacked vertically and coupled together using through-silicon vias; determining (504) that an error has been detected in one of the plurality of memory chips in the 3D stacked memory structure; selecting (506), based on the detected error, an order of an ECC decoder of the ECC stored in the ECC memory chip; and correcting (508) the detected error in the 3D stacked memory structure using the ECC stored in the ECC memory chip.

The method of FIG. 7 differs from the method of FIG. 5, however, in that the method of FIG. 5 further includes in response to selecting, based on the detected error, the order of the ECC decoder of the ECC, allocating (702) an unused portion of the ECC memory chip for mainline data storage. Allocating (702) an unused portion of the ECC memory chip for mainline data storage may be carried out by the memory controller placing address ranges within the ECC memory chip into the pool of unused memory so that other components of the system may store data at those addresses in the ECC memory chip. The ECC bits (particularly for low order ECC decoders) may not fully utilize all available space in the ECC memory chip. The memory logic chip may determine, once an order of the ECC decoder is selected, that unused space in the ECC memory chip may be used for other purposes. The memory controller can then determine the range of the unused portion of the ECC memory chip and make that space available for other uses, such as mainline data storage (i.e., storage available to other memory users), maintenance data, or monitoring data. If the order of the ECC decoder changes and requires additional ECC bits, the area of the ECC memory chip may be recaptured for use by the ECC decoder and ECC bits.

Figure 8:
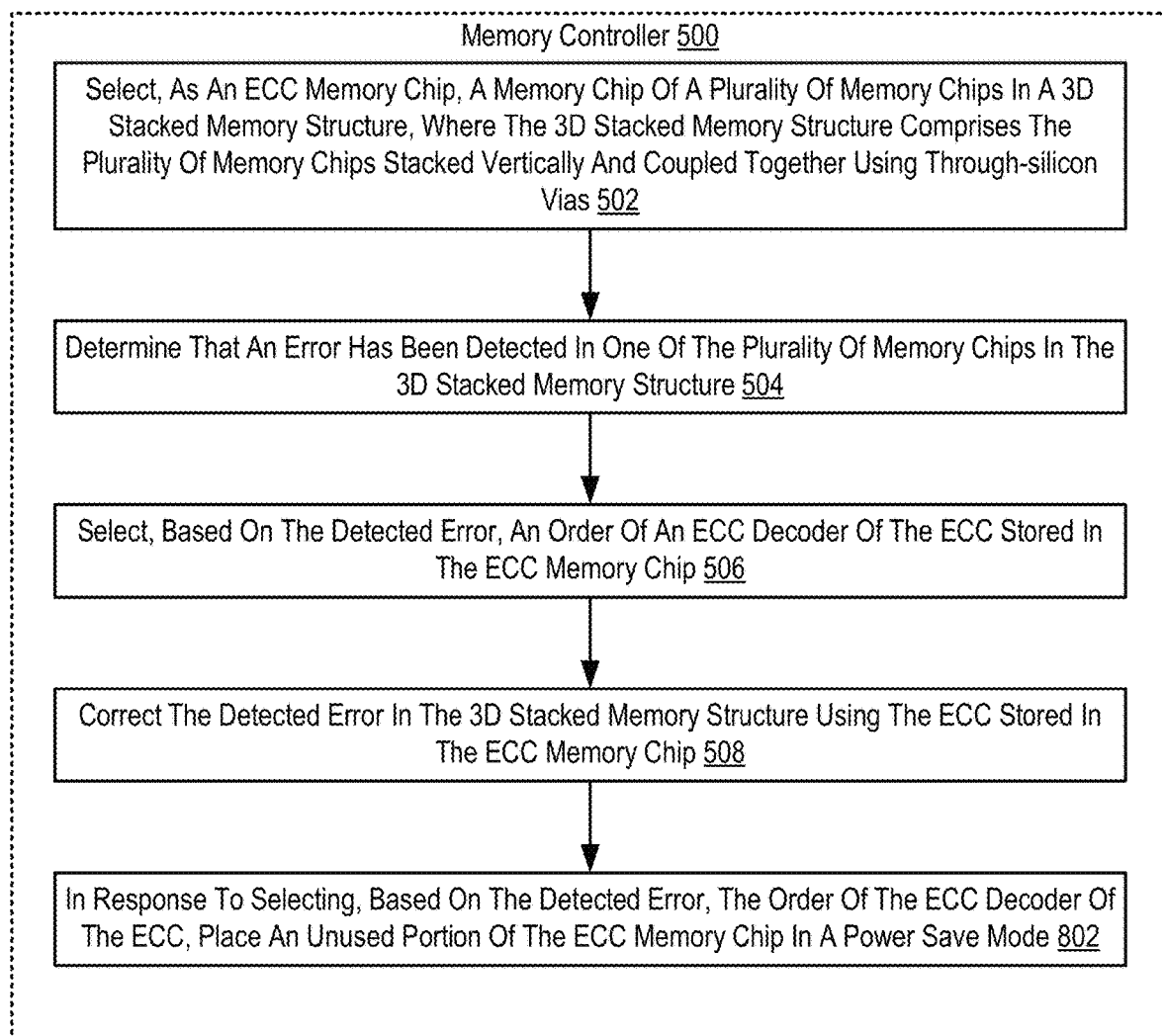
FIG. 8 sets forth a flow chart illustrating an exemplary method for optimizing ECC in 3D stacked memory according to embodiments of the present invention.

For further explanation, FIG. 8 sets forth a flow chart illustrating a further exemplary method for optimizing error correcting code (ECC) in three-dimensional (3D) stacked memory according to embodiments of the present invention that includes selecting (502), as an ECC memory chip, a memory chip of a plurality of memory chips in a 3D stacked memory structure, wherein the 3D stacked memory structure comprises the plurality of memory chips stacked vertically and coupled together using through-silicon vias; determining (504) that an error has been detected in one of the plurality of memory chips in the 3D stacked memory structure; selecting (506), based on the detected error, an order of an ECC decoder of the ECC stored in the ECC memory chip; and correcting (508) the detected error in the 3D stacked memory structure using the ECC stored in the ECC memory chip.

The method of FIG. 8 differs from the method of FIG. 5, however, in that the method of FIG. 6 further includes in response to selecting, based on the detected error, the order of the ECC decoder of the ECC, placing (802) an unused portion of the ECC memory chip in a power save mode. Placing (802) an unused portion of the ECC memory chip in a power save mode may be carried out by diverting power away from the hardware necessary to maintain the usability of the unused portions of the ECC memory chip. The memory controller (500) may supply only enough power to operate or backup the portions of the ECC memory chip that are currently being used for ECC bits.

Placing (802) an unused portion of the ECC memory chip in a power save mode may also be carried out by placing other ECC logic elsewhere on the memory controller (500) in a power save mode. ECC decoders on the memory logic chip and/or the memory controller may be placed in power save mode if those ECC decoders are not being used. For example, if a memory controller (500) includes five ECC decoders, and only three of the ECC decoders are currently in use, then the hardware for the remaining ECC decoders may be placed in a power save mode (e.g., diverting power away from the unused ECC decoders to reduce overall power consumption).

In view of the explanations set forth above, readers will recognize that the benefits of optimizing error correcting code (ECC) in three-dimensional (3D) stacked memory according to embodiments of the present invention include:

- Improving the operation of a 3D stacked memory structure by selecting an ECC decoder based on actual memory system need instead of using a high order ECC decoder to handle all anticipated error correction requirements, increasing computing system efficiency.
- Improving the operation of a 3D stacked memory structure by only utilizing the necessary memory space and hardware components to operate the ECC decoders required for the present makeup and condition of the memory structure, increasing computing system functionality.

Exemplary embodiments of the present invention are described largely in the context of a fully functional computer system for optimizing ECC in 3D stacked memory. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of optimizing error correcting code (ECC) in three-dimensional (3D) stacked memory, the method comprising:
    selecting, as an ECC memory chip, a memory chip of a plurality of memory chips in a 3D stacked memory structure, wherein the 3D stacked memory structure comprises the plurality of memory chips stacked vertically and coupled together using through-silicon vias;
    determining that an error has been detected in one of the plurality of memory chips in the 3D stacked memory structure;
    selecting, based on the detected error, an ECC decoder of the ECC stored in the ECC memory chip, wherein the ECC decoder corrects the detected error by selecting an order of the ECC decoder, and wherein the order of the ECC decoder describes the amount of ECC bits used by the selected decoder; and
    correcting the detected error in the 3D stacked memory structure using the selected ECC decoder and the ECC stored in the ECC memory chip.

2. The method of claim 1, wherein selecting, based on the detected error, the order of the ECC decoder comprises one selected from a group consisting of selecting a high order ECC decoder and selecting a low order ECC decoder.

3. The method of claim 1, wherein the plurality of memory chips comprises at least two types of memory chips.

4. The method of claim 1, further comprising:
    in response to selecting, based on the detected error, the order of the ECC decoder of the ECC, allocating an unused portion of the ECC memory chip for mainline data storage.

5. The method of claim 1, further comprising:
    in response to selecting, based on the detected error, the order of the ECC decoder of the ECC, placing an unused portion of the ECC memory chip in a power save mode.

6. The method of claim 1, wherein selecting the order of the ECC decoder is further based on at least one selected from a group consisting of: memory maintenance results, memory controller self-test results, a mode of the ECC, and an application error tolerance.

7. The method of claim 1, wherein selecting, as the ECC memory chip, the memory chip of the plurality of memory chips in the 3D stacked memory structure comprises selecting the memory chip vertically opposite from a memory logic chip.

8. An apparatus for optimizing error correcting code (ECC) in three-dimensional (3D) stacked memory, the apparatus configured to carry out the steps of:
    selecting, as an ECC memory chip, a memory chip of a plurality of memory chips in a 3D stacked memory structure, wherein the 3D stacked memory structure comprises the plurality of memory chips stacked vertically and coupled together using through-silicon vias;
    determining that an error has been detected in one of the plurality of memory chips in the 3D stacked memory structure;
    selecting, based on the detected error, an ECC decoder of the ECC stored in the ECC memory chip, wherein the ECC decoder corrects the detected error by selecting an order of the ECC decoder, and wherein the order of the ECC decoder describes the amount of ECC bits used by the selected decoder; and
    correcting the detected error in the 3D stacked memory structure using the selected ECC decoder and the ECC stored in the ECC memory chip.

9. The apparatus of claim 8, wherein selecting, based on the detected error, the order of the ECC decoder comprises one selected from a group consisting of selecting a high order ECC decoder and selecting a low order ECC decoder.

10. The apparatus of claim 8, wherein the plurality of memory chips comprises at least two types of memory chips.

11. The apparatus of claim 8, further comprising:
    in response to selecting, based on the detected error, the order of the ECC decoder of the ECC, allocating an unused portion of the ECC memory chip for mainline data storage.

12. The apparatus of claim 8, further comprising:
    in response to selecting, based on the detected error, the order of the ECC decoder of the ECC, placing an unused portion of the ECC memory chip in a power save mode.

13. The apparatus of claim 8, wherein selecting the order of the ECC decoder is further based on at least one selected from a group consisting of: memory maintenance results, memory controller self-test results, a mode of the ECC, and an application error tolerance.

14. The apparatus of claim 8, wherein selecting, as the ECC memory chip, the memory chip of the plurality of memory chips in the 3D stacked memory structure comprises selecting the memory chip vertically opposite from a memory logic chip.

15. A computer program product for optimizing error correcting code (ECC) in three-dimensional (3D) stacked memory, the computer program product disposed upon a non-transitory computer readable medium, the computer program product comprising computer program instructions that, when executed, cause a memory controller to carry out the steps of:

selecting, as an ECC memory chip, a memory chip of a plurality of memory chips in a 3D stacked memory structure, wherein the 3D stacked memory structure comprises the plurality of memory chips stacked vertically and coupled together using through-silicon vias;

determining that an error has been detected in one of the plurality of memory chips in the 3D stacked memory structure;

selecting, based on the detected error, an ECC decoder of the ECC stored in the ECC memory chip, wherein the ECC decoder corrects the detected error by selecting an order of the ECC decoder, and wherein the order of the ECC decoder describes the amount of ECC bits used by the selected decoder; and correcting the detected error in the 3D stacked memory structure using the selected ECC decoder and the ECC stored in the ECC memory chip.

16. The computer program product of claim 15, wherein selecting, based on the detected error, the order of the ECC decoder comprises one selected from a group consisting of selecting a high order ECC decoder and selecting a low order ECC decoder.

17. The computer program product of claim 15, wherein the plurality of memory chips comprises at least two types of memory chips.

18. The computer program product of claim 15, the computer program instructions further comprising:

in response to selecting, based on the detected error, the order of the ECC decoder of the ECC, allocating an unused portion of the ECC memory chip for mainline data storage.

19. The computer program product of claim 15, the computer program instructions further comprising:

in response to selecting, based on the detected error, the order of the ECC decoder of the ECC, placing an unused portion of the ECC memory chip in a power save mode.

20. The method of claim 15, wherein selecting the order of the ECC decoder is further based on at least one selected from a group consisting of: memory maintenance results, memory controller self-test results, a mode of the ECC, and an application error tolerance.

* * * * *